United States Patent
Curet

(10) Patent No.: US 6,594,624 B1
(45) Date of Patent: Jul. 15, 2003

(54) METHOD OF IDENTIFYING ALL MINIMUM-COST CUTSETS IN A NETWORK

(75) Inventor: Norman D. Curet, Severn, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 0 days.

(21) Appl. No.: 09/387,882

(22) Filed: Sep. 1, 1999

Related U.S. Application Data

(60) Provisional application No. 60/140,205, filed on Jun. 22, 1999.

(51) Int. Cl.[7] .............................................. G06F 17/50
(52) U.S. Cl. ........................... 703/2; 709/238; 709/240; 709/241; 370/351
(58) Field of Search ................................ 709/238, 239, 709/241, 240; 370/351, 357; 716/7, 8, 10; 703/2; 705/7

(56) References Cited

U.S. PATENT DOCUMENTS

| | | | |
|---|---|---|---|
| 5,257,201 A | * 10/1993 | Berman et al. | 364/489 |
| 5,666,290 A | 9/1997 | Li et al. | |
| 5,748,844 A | 5/1998 | Marks | |
| 5,978,588 A | * 11/1999 | Wallace | 395/709 |
| 6,047,331 A | * 4/2000 | Medard et al. | 709/239 |
| 6,065,063 A | * 5/2000 | Abali | 709/242 |
| 6,282,170 B1 | * 8/2001 | Bentall et al. | 370/225 |

OTHER PUBLICATIONS

C. Patvardhan et.al., Vertex Cutsets of Undirected Graphs, IEEE Trans. on. Reliability, vol. 44, No. 2, Jun. 1995, pp. 347–353.

Chandra S. Chekuri et al., Experimental Study of Minimum Cut Algorithms, Proceedings of the 8th Annual ACM–SIAM Symposium on Discreet Algorithms (SODA) 1997.

* cited by examiner

Primary Examiner—Samuel Broda
Assistant Examiner—Thai Phan
(74) Attorney, Agent, or Firm—Robert D. Morelli

(57) ABSTRACT

The present invention is a method of identifying all minimum-cost cutsets in a network to isolate two nodes S and T, by receiving a network that includes nodes and links; replacing each bidirectional link with two unidirectional links; assigning a cost to each node and link; choosing nodes S and T; removing any extraneous nodes and links that are not along a path from S to T; adding a node next to each original node; moving the links directed out of the original node to its added node; adding a link directed out of the original node and into its added node; assigning a cost to each added link that is equal to the cost of the corresponding original node; finding the paths from S to T that maximize the amount of flow from S to T, where flow capacity is equal to cost; generating a residual graph; finding each set of nodes in the residual graph that includes S, does not include T, and does not include a link directed from a node within the set to a node outside of the set; finding, for each closure, any links connected to the closure that are not members of the closure; choosing the minimum-cost cutset on which is most convenient to act; and eliminating the links and nodes as required by the minimum-cost cutset chosen in the last step to isolate S from T.

13 Claims, 17 Drawing Sheets

METHOD OF IDENTIFYING ALL MINIMUM-COST CUTSETS IN A NETWORK

This application claims the benefit of U.S. Provisional Application No. 60/140,205, filed Jun. 22, 1999.

FIELD OF THE INVENTION

The present invention relates, in general, to information processing system organization and, in particular, to flow controlling.

BACKGROUND OF THE INVENTION

Any network of items may be represented as a graph using nodes and links, where each node represents an item in the network, and where each link represents a connection from one node to another. Examples of such networks include telephone networks, integrated circuits, computer networks, infrastructure networks (e.g., roads, trains, etc.), and so on.

The ability to analyze the links and nodes in a graph according to certain criteria is useful for many different purposes. For example, a electric company may wish to isolate, or remove, a substation from its power grid due to a malfunction at that substation. A designer may wish to determine the optimum placement of circuit components on an integrated circuit to optimize circuit performance. Operators of a computer network (e.g., the INTERNET) may wish to isolate a computer from the network if the computer become infected with a virus and thus prevent other computers in the network from becoming infected with the virus. A set of links or nodes to be removed from a graph to isolate one node from another node is often referred to as a cutset.

In an article entitled "Vertex Cutsets of Undirected Graphs," published June 1995, in IEEE *Transactions on Reliability*, Vol. 44, No. 2, C. Patvardhan et al. disclosed a method of identifying every possible cutset for isolating two nodes from one another, regardless of the cost associated with cutting a node or link. Since the number of possible cutsets for isolating two nodes from one another grows exponentially as the number of nodes and/or links increases, the method disclosed by Patvardhan et al. becomes computationally prohibitive when dealing with a large network. The present invention discloses a computationally efficient method of finding links and, possibly, nodes, that cost the least to cut, or eliminate, to isolate two user-selected nodes from each other.

In an article entitled "Experimental Study of Minimum Cut Algorithms," published 1997, in *Proceedings of the 8th Annual* ACM-SIAM *Symposium on Discrete Algorithms*, Chandra S. Chekuri et al. disclosed a survey of the most efficient cutset algorithms available in 1997. The algorithms disclosed therein find one cutset that minimizes the cost associated with cutting the links, but do not find all of the possible cutsets that minimize the cost associated with cutting the links as does the present invention.

U.S. Pat. No. 5,666,290, entitled "INTERACTIVE TIME-DRIVEN METHOD OF COMPONENT PLACEMENT THAT MORE DIRECTLY CONSTRAINS CRITICAL PATHS USING NET-BASED CONSTRAINTS," discloses a method of placing circuit components on an integrated circuit to optimize circuit performance by finding one cutset that minimizes cost. U.S. Pat. No. 5,666,290 does not disclose a method of finding all cutsets that minimize cost as does the present invention. U.S. Pat. No. 5,666,290 is hereby incorporated by reference into the specification of the present invention.

U.S. Pat. No. 5,748,844, entitled "GRAPH PARTITIONING SYSTEM," discloses a device for partitioning a graph by starting with 100 cutsets, reducing the 100 to the best 20 and picking the best cutset therefrom. U.S. Pat. No. 5,748,844 does not disclose a method of finding all minimum cost cutsets as does the present invention. U.S. Pat. No. 5,748,844 is hereby incorporated by reference into the specification of the present invention.

SUMMARY OF THE INVENTION

It is an object of the present invention to identify, in a computationally-efficient manner, all minimum-cost cutsets in a network to isolate one node in the network from another node.

It is an object of the present invention to identify, in a computationally-efficient manner, all minimum-cost cutsets in a network to isolate one node in the network from another node, where the network is any suitable network such as a computer network, a telephone network, an infrastructure network, an integrated-circuit interconnection network, and so on.

The present invention is the first method of identifying, in a computationally-efficient manner, all minimum-cost cutsets in a network to isolate one node in the network from another node. The present invention is applicable to any suitable network such as a computer network, a telephone network, an infrastructure network, an integrated circuit interconnection network, and so on.

The first step of the present invention is receiving a suitable network, where the network includes nodes and links between the nodes. The links may be unidirectional or bidirectional.

The second step is replacing each bidirectional link with two unidirectional links, where the two unidirectional links are parallel to each other and directed in opposite directions from each other.

The third step is assigning a non-negative value, or cost, to each node and link in the network. The cost assigned to each node or link is the cost of eliminating, or cutting, that node or link from the network.

The fourth step is choosing two nodes in the network, a source node S and a termination node T, between which it is desired to find all minimum-cost cutsets.

The fifth step is removing any extraneous nodes and links that are not along a path from node S to node T.

The sixth step is adding a node next to each node that is original to the network.

The seventh step is moving, for each node that is original to the network, the links directed away from the node to its added node so that such links are directed away from the added node.

The eighth step is adding, to each node that is original to the network, a link directed out of the node and directed into its added node.

The ninth step is assigning a non-negative value, or cost, to each link added in the last step that is equal to the non-negative value, or cost, of the corresponding node that is original to the network.

The tenth step is finding the paths from node S to node T in the network as modified by steps two through nine that maximize flow from node S to node T. The flow capacity of a node, or link, is equal to the cost assigned to that node, or link.

The eleventh step is creating a residual graph of the network as modified by steps two through nine by including all original nodes of the network; including all nodes added to the network; including all links, with direction maintained, from the network that were not identified in the previous step as being a part of a maximum-flow path; including all links, with directions reversed, from the network that were identified as being a part of a maximum-flow path and carried flow at capacity; including all links, with direction maintained, from the network that were identified as being a part of a maximum-flow path and carried flow at less than capacity; and adding a link, in the opposite direction, for each link from the network that was identified as being a part of a maximum-flow path and carried flow at less than capacity. The residual graph contains non-maximum-cost paths from node S to node T from which will be found all minimum-cost cutsets for the network.

The twelfth step is finding each set of nodes in the residual graph that includes node S, does not include node T, and does not include a link directed from a node within the set to a node outside of the set. A set of nodes that meets the three criteria listed above is commonly referred to as a closure. All minimum-cost cutsets of the network are found using the closures of the residual graph. The number of minimum-cost cutsets of the network is less than or equal to the number of closures of the residual graph.

The thirteenth step is finding in the network as modified by steps two through nine, for each closure, any link directed from a node within the closure to a node outside of the closure. Such a set of links found for one particular closure constitutes one possible minimum-cost cutset for the network. The sets of links found for all of the closures constitute all of the possible minimum-cost cutsets for the network. If a minimum-cost cutset includes a link between a node that is original to the network and its added node then the node that is original to the network must be eliminated because such a link is a theoretical construct used to find all of the minimum-cost cutsets and does not physically exist in the actual network.

The fourteenth step is selecting a minimum-cost cutset that is the most convenient cutset to act on from all of the minimum-cost cutsets found in the last step.

The fifteenth, and last, step is eliminating the links and nodes, as required by the minimum-cost cutset chosen in the last step, to isolate node S from node T.

DETAILED DESCRIPTION

The present invention is the first method of identifying, in a computationally-efficient manner, all minimum-cost cutsets in a network to isolate one node in the network from another node in the network. The present invention is applicable to any suitable network such as a computer network, a telephone network, an infrastructure network, an integrated-circuit interconnection network, and so on.

Figure 1:
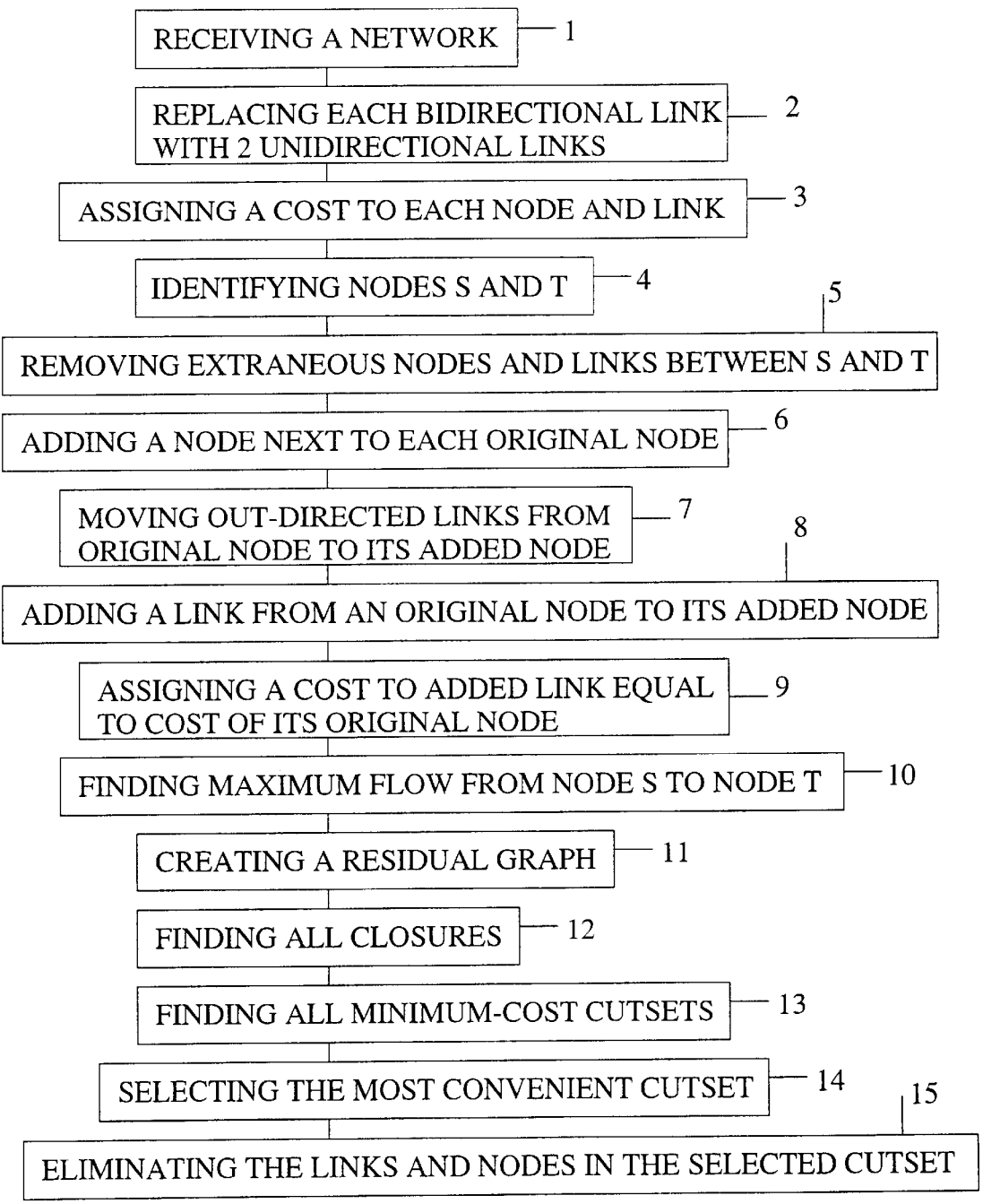
FIG. 1 is a flowchart of steps of the present invention.

FIG. 1 is a flowchart of the steps of the present invention.

Figure 2:
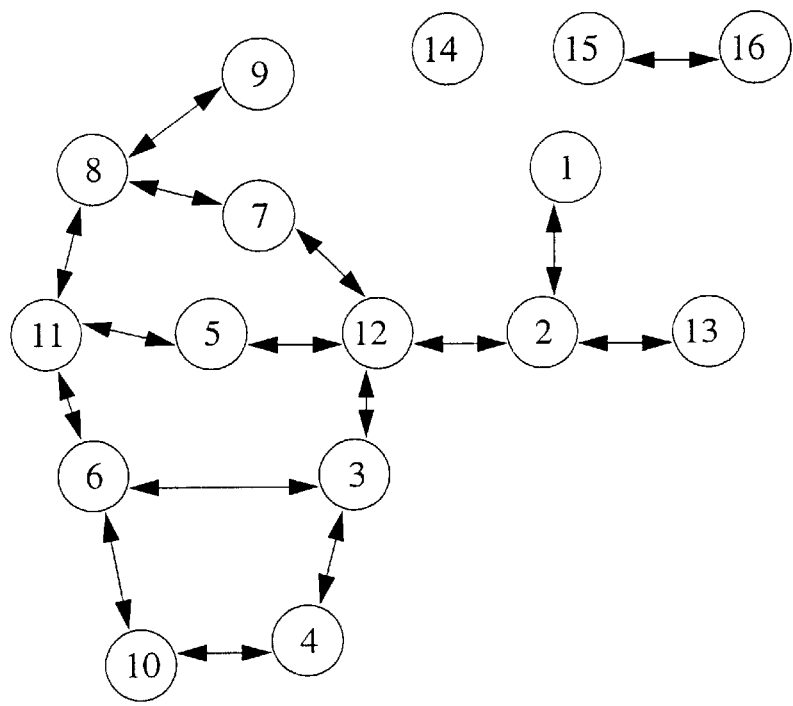
FIG. 2 is an illustration of a network.

The first step 1 is receiving a suitable network, where the network includes nodes and links between the nodes, and where the links may be unidirectional or bidirectional. FIG. 2 is an illustration of one possible network on which the present method may be applied. The nodes in the network of FIG. 2 are connected to zero, one, or two other nodes. All of the links in the network of FIG. 2 are bidirectional.

Figure 3:
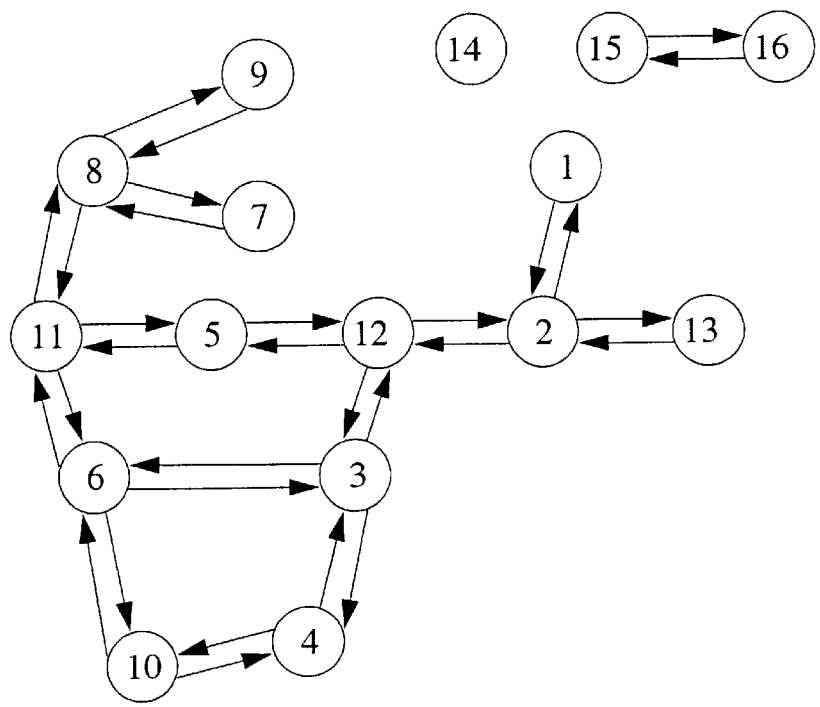
FIG. 3 is an illustration of the network of FIG. 2 with only unidirectional links.

The second step 2 in FIG. 1 is replacing each bidirectional link with two unidirectional links, where the two unidirectional links are parallel to, and in opposite directions from, each other. FIG. 3 is an illustration of the network of FIG. 2, where each bidirectional link is replaced with two unidirectional links according to the second step 2 of FIG. 1.

The third step 3 is assigning a non-negative value, or cost, to each node and link in the network. The cost assigned to each node or link is the cost of eliminating, or cutting, that node or link from the network. For illustrative purposes, assume that each node has a cost of two and each link has a cost of one. These costs are not shown in any figure.

The fourth step 4 of FIG. 1 is choosing two nodes in the network, a source node S and a termination node T, between which it is desired to find all minimum-cost cutsets. For the example illustrated in FIG. 2, node 8 is chosen as the source node S and node 10 is chosen as the termination node T.

Figure 4:
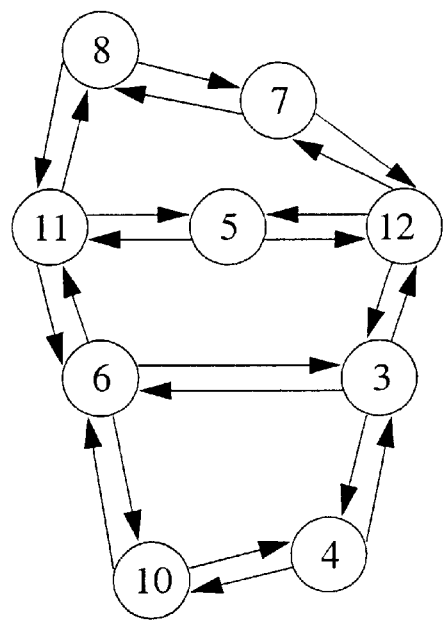
FIG. 4 is an illustration of the network of FIG. 3 with extraneous nodes and links removed.
Figure 9:
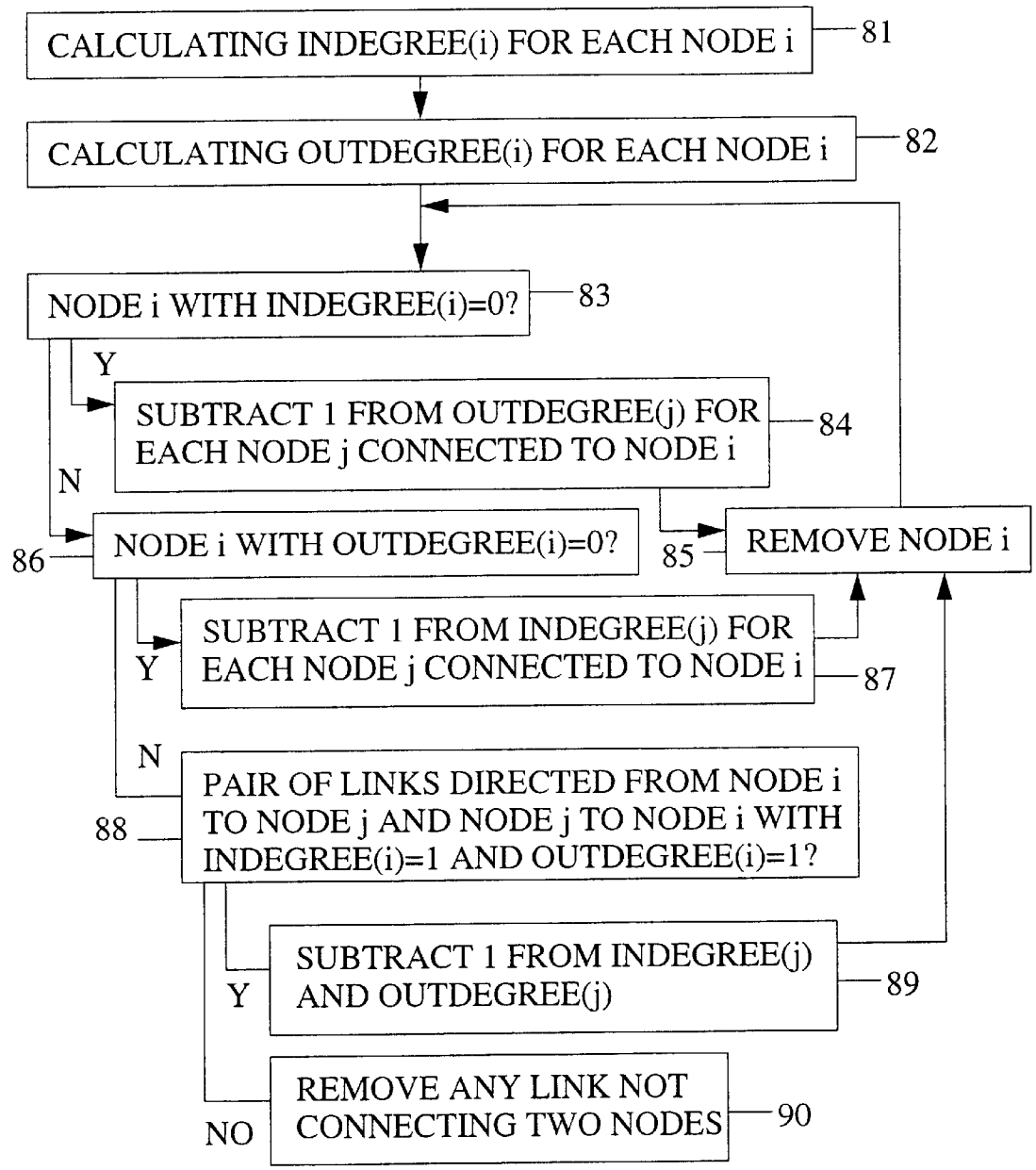
FIG. 9 is a flowchart of steps for removing extraneous nodes and links.

The fifth step 5 in FIG. 1 is removing any extraneous nodes and links that are not along a path from node S to node T. FIG. 4 is an illustration of the network of FIG. 3 with extraneous nodes and links removed. That is, nodes 1, 2, 9, 13, 14, 15, 16, and the links to and from these nodes were removed. FIG. 9 is a flowchart of the steps for removing extraneous nodes and links from the network. The steps of FIG. 9 are described below.

The sixth step 6 of FIG. 1 is adding a node next to each node that is original to the network.

The seventh step 7 is moving, for each node that is original to the network, the links directed out of the original node to its added node so that such links are directed out of the added node.

Figure 5:
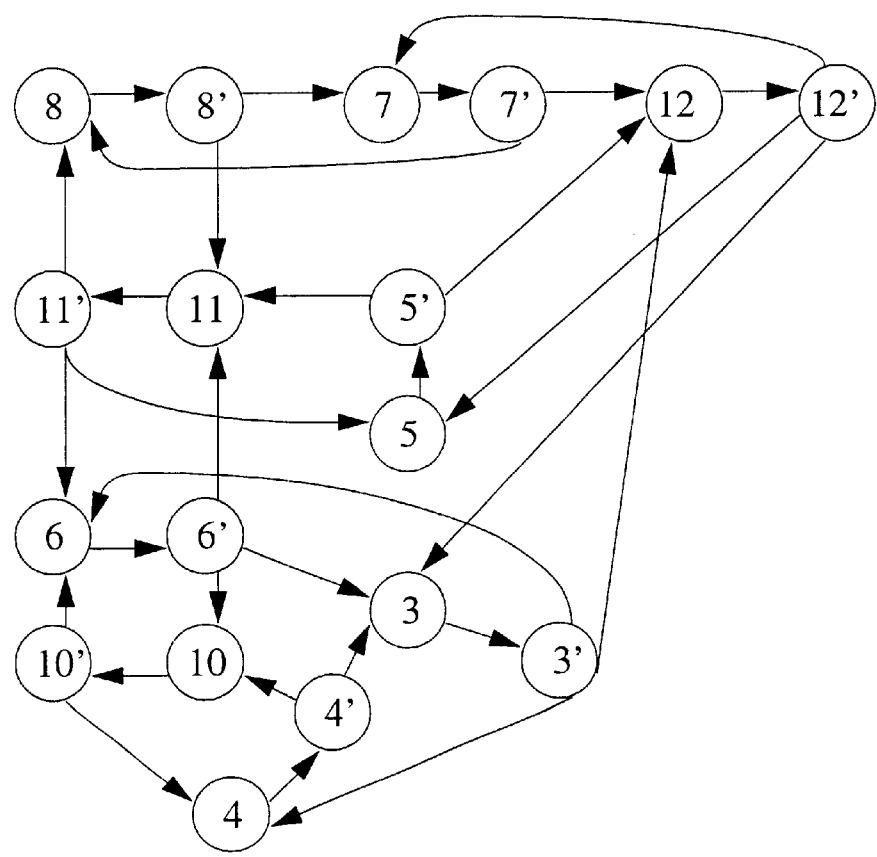
FIG. 5 is an illustration of the network of FIG. 4 with nodes added.

The eighth step 8 is adding, to each node that is original to the network, a link directed out of the original node and into its added node. FIG. 5 is an illustration of the network as modified by the seventh 7 and eighth 8 steps, showing the original nodes, the added nodes, the links moved from the original nodes to the added nodes, and the links added between the original nodes and the added nodes.

The ninth step 9 in FIG. 1 is assigning a non-negative value, or cost, to each link added in the last step that is equal to the non-negative value, or cost, of the corresponding node that is original to the network. The costs are not shown in any figure.

The sixth 6 through ninth 9 steps result in each node that is original to the network being modified to include an added node. Links originally directed into an original node remain directed into the original node. Links originally directed out of an original node are directed out of the added node. Also, a link is added between each original node and its added node, where the link is directed out of the original node and into its added node. The added link is assigned a cost equal to the cost of the corresponding node that is original to the network. If the added link appears in a minimum-cost cutset then this indicates that the corresponding original node must be eliminated along with the other identified links to isolate node S from node T. Hereinafter the term node includes both the nodes original to the network and the added nodes.

Figure 6:
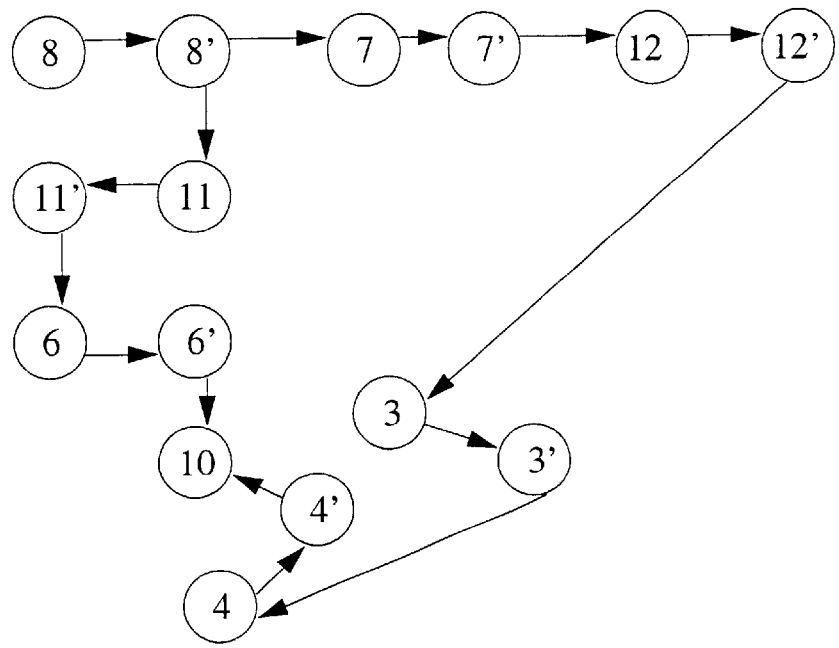
FIG. 6 is an illustration of the maximum flow paths for the network of FIG. 5.

The tenth step 10 is finding the paths from node S to node T, in the network as modified by step two 2 through step nine 9, that maximize the amount of flow from node S to node T, where the flow capacity of each node, or link, is equal to the cost assigned to that node, or link. FIG. 6 is an illustration of the paths that result in the maximum flow between nodes 8 and 10 of the network of FIG. 5. In FIG. 6, there are two paths from node 8 to node 10, each of flow one, that cause a maximum flow of two from node 8 to node 10. These two paths are 8-8'-11-11'-6-6'-10 and 8-8'-7-7'-12-12'-3-3'-4-4'-10, where a number indicates a node that is original to the network, where an apostrophe indicates a node that was added to the network, and where a dash indicates a link directed from the previous node to the following node. Note that the flow in a path is set by the minimum-capacity element in the path. A link or node is analogous to a pipe, where the flow capacity of the link or node is analogous to the diameter of the pipe. The flow in a link or node is analogous to water flowing in a pipe. If a smaller diameter pipe is placed before a larger diameter pipe in a path then it should be clear that the amount of flow in the larger pipe is no more than the maximum capacity of the smaller pipe. If a larger diameter pipe is placed before a smaller diameter pipe in a path then it should also be clear that the amount of flow in the smaller pipe is no more than the maximum capacity of the smaller pipe even if the larger pipe received a flow equal to its maximum capacity.

Figure 10:
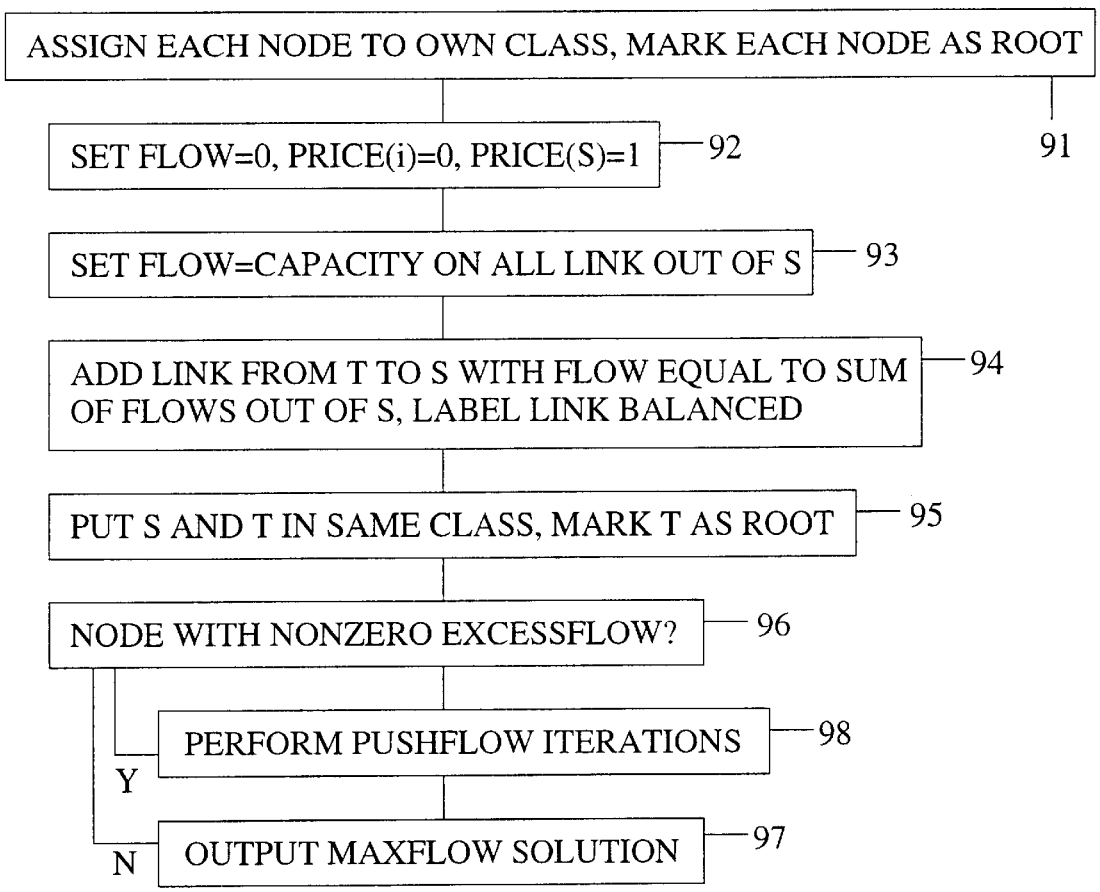
FIG. 10 is a flowchart of steps for maximizing the flow between nodes S and T.

FIGS. 10–17 list the steps for maximizing flow between two nodes. FIG. 10 lists the steps of the overall method of maximizing flow between two nodes, while FIGS. 11–17 list additional steps for realizing various steps within these figures. FIGS. 10–17 are described below.

Figure 7:
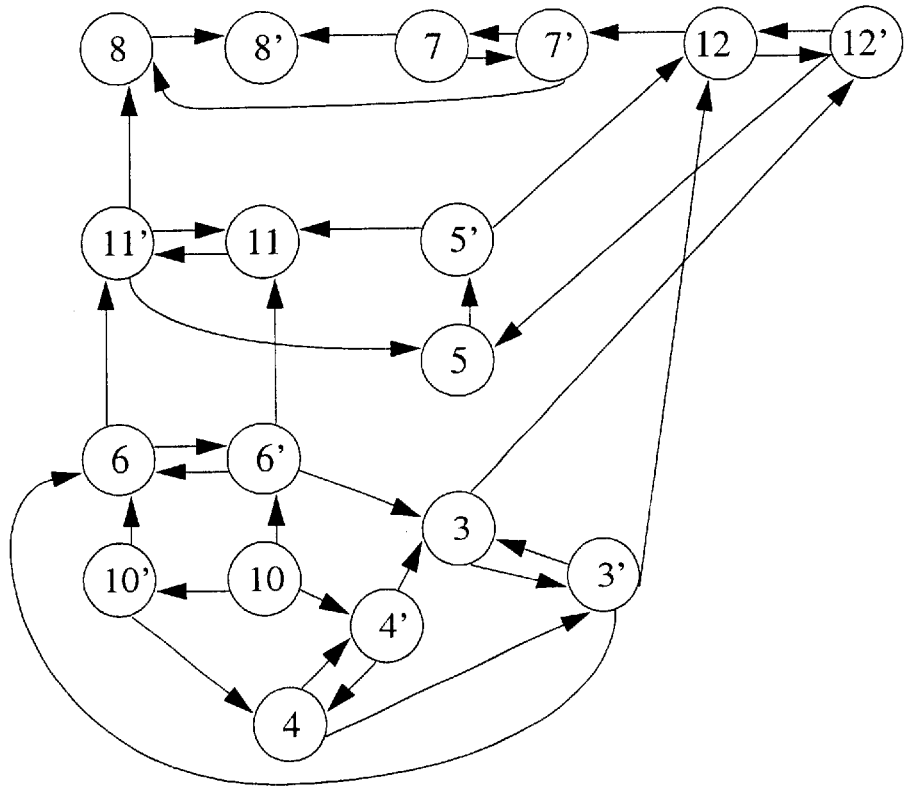
FIG. 7 is an illustration of the residual graph for the network of FIG. 5.

The eleventh step 11 in FIG. 1 is creating a residual graph by including all original nodes of the network; including all added nodes of the network; including all links, with direction maintained, from the network that were not identified in the previous step as being a part of a maximum flow path; including all links, with directions reversed, from the network that were identified as being a part of a maximum flow path and carried flow at capacity; including all links, with direction maintained, from the network that were identified as being a part of a maximum flow path and carried flow at less than capacity; and adding a link, in the opposite direction, for each link from the network that was identified as being a part of a maximum flow path and carried flow at less than capacity. In other words, a residual graph of a network which was modified by step two 2 through step nine 9 is a graph that includes all paths of the modified network that are not part of a maximum-flow path and the paths that are part of the maximum-flow, where the links in the maximum-flow are modified as follows: links that carry flow at their capacity are reversed and links that carry flow at less than their capacity are included in the residual graph along with a copy of that link, where the direction of the copied link is reversed with respect to the link on which it is based. If there is more than one link directed from a first node to a second node in the residual graph then these links may be merged into one link directed from the first node to the second node. The residual graph contains non-maximum cost paths from node S to node T from which will be found all minimum-cost cutsets for the network. FIG. 7 is an illustration of the residual graph for the network of FIG. 5.

The twelfth step 12 is finding each set of nodes in the residual graph that includes node S, does not include node T, and does not include a link directed from a node within the set to a node outside of the set. A set of nodes that meets these three criteria is commonly referred to as a closure. All minimum-cost cutsets of the network are found using the closures of the residual graph. The number of minimum-cost cutsets of the network is less than or equal to the number of closures of the residual graph. The closures of the residual graph depicted in FIG. 7 are (8, 8'), (7, 7', 8, 8'), (5, 5', 7, 7',8, 8', 11, 11', 12, 12'), (3,3', 5,5', 6,6', 7,7', 8,8', 11, 11', 12, 12'), and (3,3', 4,4', 5,5', 6,6', 7,7', 8,8', 11, 11', 12, 12').

The thirteenth step 13 of FIG. 1 is finding, for each closure found from the residual graph in the last step, any link directed from a node within the closure in the network as modified by step two 2 through step nine 9 to a node outside of the closure. Such a set of links found for one particular closure constitutes one possible minimum-cost cutset for the network. The sets of links found for all of the closures constitute all of the possible minimum-cost cutsets for the network. Five closures where found using the residual graph of FIG. 7. Once the closures are identified, the present method returns to the network as modified by steps two 2 through nine 9 to find all of the minimum-cost cutsets for the network. Note that the residual graph is only used to identify the closures of the network in question. Once the closures are identified, the network as modified by steps two 2 through nine 9 is used to find all of the minimum-cost cutsets of the network.

Figure 8:
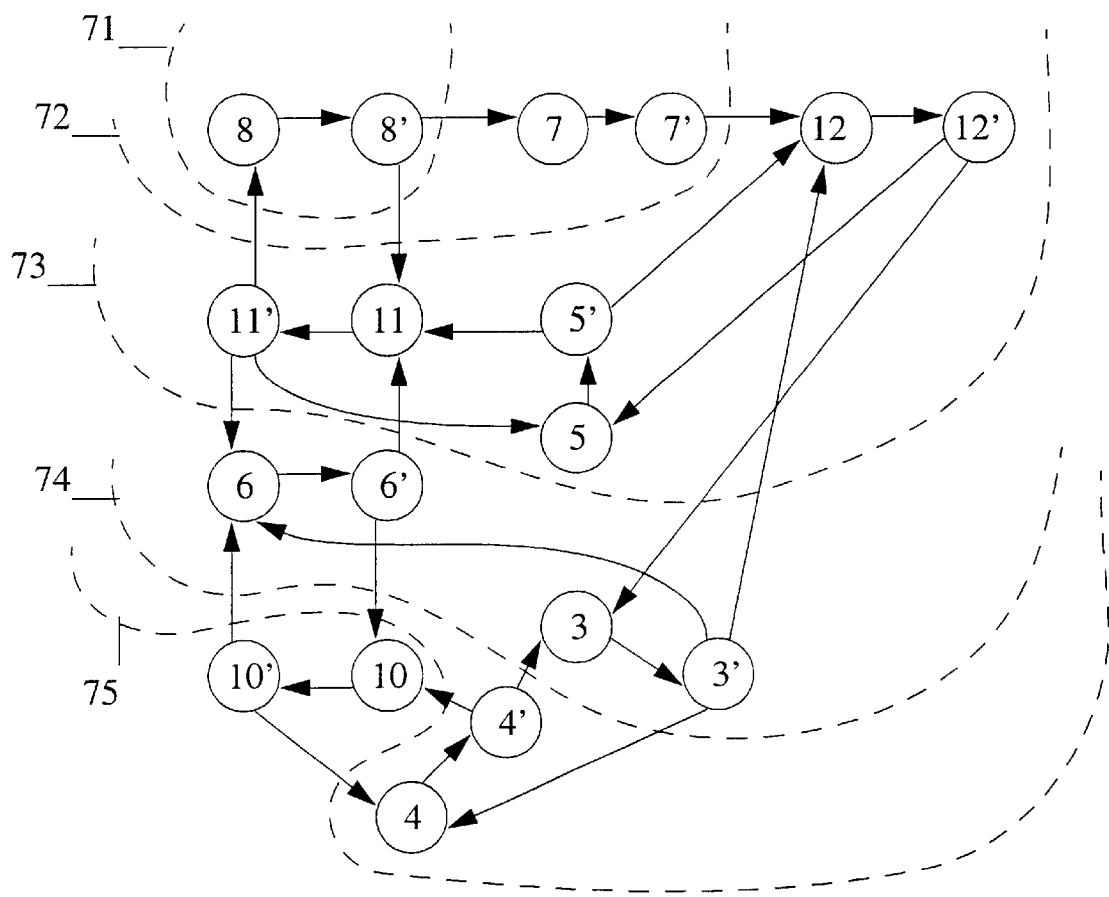
FIG. 8 is an illustration of all of the minimum-cost cutsets for the network of FIG. 5.

FIG. 8 is an illustration of all of the minimum-cost cutsets of the modified network of FIG. 5. The first minimum-cost cutset 71 of the network shown in FIG. 8 consists of a link directed from node 8' to node 7 and a link directed from node 8' to node 11. Note that a link to or from an added node (e.g., 8') is a theoretical construct for finding all minimum-cost cutsets and does not exist in the received network separate and apart from the bidirectional link which caused the added node to be created. So, cutting a bidirectional link in the network as received cuts the links to or from a node and its corresponding added node. The bidirectional link in the network as received will be cut if either of the unidirectional links generated because of the bidirectional link appears in the cutset selected in the next step. The second minimum-cost cutset 72 of the network consists of a link directed from node 8' to node 11 and a link directed from node 7' to node 12. The third minimum-cost cutset 73 of the network consists of a link directed from node 11' to node 6 and a link directed from node 12' to node 3. The fourth minimum-cost cutset 74 of the network consists of a link directed from node 6' to node 10 and a link directed from node 3' to node 4. The fifth, and last, minimum-cost cutset 75 of the network consists of a link directed from node 6' to node 10 and a link directed from node 4' to node 10.

If a minimum-cost cutset selected in the next step includes a link which was added to the network and directed toward a node added to the network then the corresponding original node must be eliminated instead of the added link because the added link is a theoretical construct that is used to identify all of the minimum-cost cutsets in the network received and does not actually exist in the received network. Such a link is not illustrated in the cutsets of FIG. 8. The links in the cutset that actually exist in the received network must also be eliminated, or cut, to isolate node S from node T.

The fourteenth step 14 is selecting the minimum-cost cutset from those found in the last step that is the most convenient cutset on which to act. Different cutsets may cost the same to cut, but one may be easier to access than another and, therefore, more convenient to cut. Since any of the cutsets will achieve the desired goal, the cutset that is easier to cut should be selected.

The fifteenth, and last, step 15 is eliminating the links and nodes as required by the minimum-cost cutset selected in the last step to isolate node S from node T.

FIG. 9 is a flowchart of the steps for removing extraneous nodes and links from the network.

The first step 81 is calculating, for each node i in the network except nodes S and T, indegree(i), where indegree (i) is the number of links directed toward node i.

The second step 82 is calculating, for each node i in the network except nodes S and T, outdegree(i), where outdegree(i) is the number of links directed away from node i.

The third step 83 is determining, for each node i in the network except nodes S and T, if indegree(i)=0.

If there is a node i with indegree(i)=0 then subtracting one from outdegree(j) if node j is connected to node i 84, removing 85 node i from the network, and returning to step 83 for further processing. Otherwise, determining 86, for each node i in the network except nodes S and T, if outdegree(i)=0.

If there is a node i with outdegree(i)=0 then subtracting one from indegree(j) if node j is connected to node i 87, removing 85 node i from the network, and returning to step 83 for further processing. Otherwise, determining 88 if there is a node i with indegree(i)=outdegree(i)=1, where the link directed toward node i comes from node j, and where the link directed away from node i is directed toward node j.

If there is a node i with indegree(i)=outdegree(i)=1, where the link directed toward node i comes from node j, and where the link directed away from node i is directed toward node j then subtracting one from indegree(j) and from outdegree(j) 89, removing 85 node i from the network, and returning to step 83 for further processing. Otherwise, removing 90 any links that are not connected to two nodes.

FIG. 10 is a flowchart of steps for maximizing the flow between two nodes.

The first step 91 is assigning each node in the modified network to its own class and marking each node as the root node of its class.

The second step 92 is setting INITIALIZEFLOW=0 for every link, setting PRICE(i)=0 for each node i, and setting PRICE(S)=1 for node S.

The third step 93 is setting CAPACITY for each link equal to the cost associated with the corresponding link and setting FLOW equal to the sum of the CAPACITYs of the links directed out of node S.

The fourth step 94 is adding a link directed from node T to node S, assigning to the link the value of FLOW defined in the previous step, and labelling the link BALANCED.

The fifth step 95 is merging nodes S and T into one class with root node T.

The sixth step 96 is determining if a node has an EXCESSFLOW that is nonzero, where EXCESSFLOW=Σ (flow into the node)−Σ(flows out of the node).

If there is no node with a nonzero EXCESSFLOW then returning 97 the maximum flow solution. Otherwise, performing PUSHFLOW ITERATIONS 98 and returning to the sixth step 96. The steps for performing PUSHFLOW ITERATIONS 98 are listed in FIG. 11 and described below.

Figure 11:
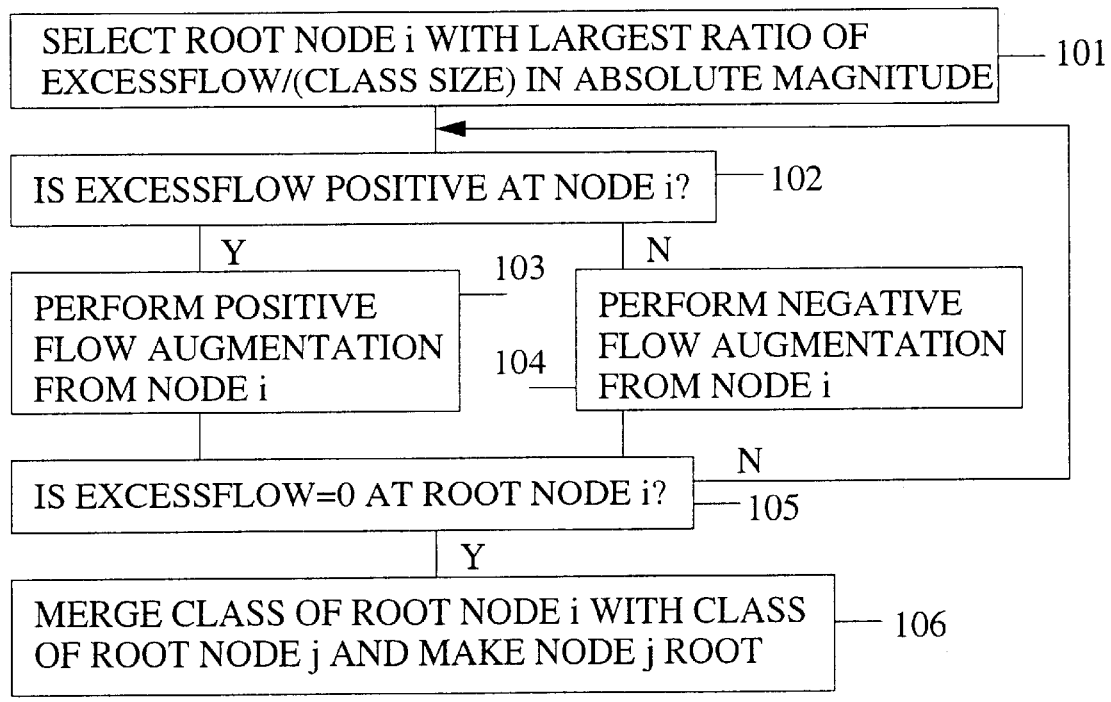
FIG. 11 is a flowchart of steps for performing PUSH-FLOW ITERATIONS.

FIG. 11 is a flowchart of steps for performing PUSH-FLOW INTERATIONS, step number 98 in FIG. 10.

The first step 101 in FIG. 11 is finding the root node i that has the largest ratio of EXCESSFLOW to class size in absolute magnitude.

The second step 102 is determining if EXCESSFLOW for root node i is positive.

If EXCESSFLOW for root node i is positive then performing POSITIVE FLOW AUGMENTATION 103 from node i. Otherwise, performing NEGATIVE FLOW AUGMENTATION 104 from root node i. The steps for performing POSITIVE FLOW AUGMENTATION 103 are listed in FIG. 12 and described below. The steps for performing NEGATIVE FLOW AUGMENTATION 104 are listed in FIG. 13 and described below.

The next step 105 is determining if EXCESSFLOW=0 at root node i.

If EXCESSFLOW=0 for root node i then merging 106 the class containing root node i with the class containing root node j, and designating node j as the root of class formed in this step. Otherwise, returning to the second step 102 for further processing.

Figure 12:
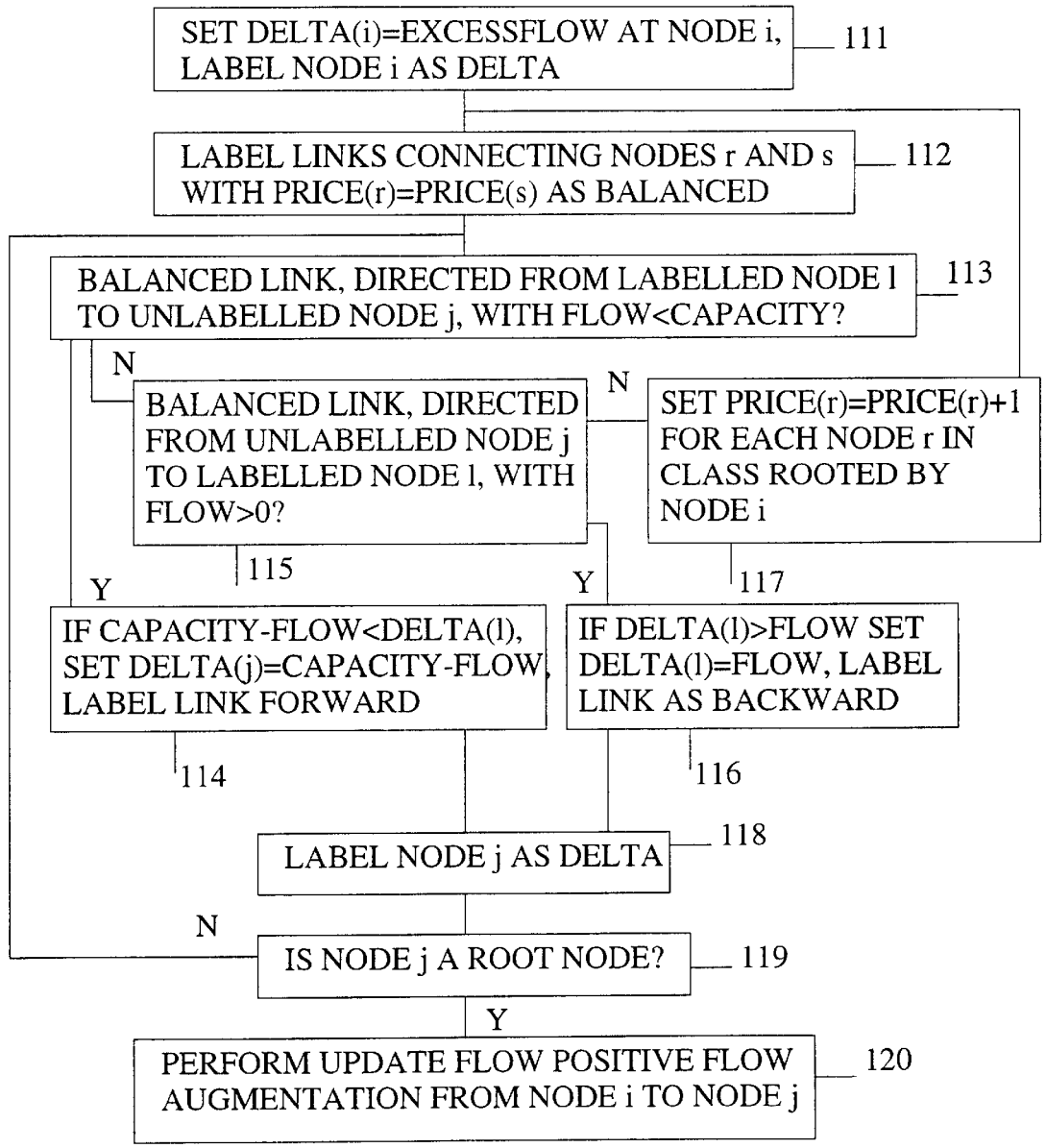
FIG. 12 is a flowchart of steps for performing POSITIVE FLOW AUGMENTATION.

FIG. 12 is a flowchart of steps for performing POSITIVE FLOW AUGMENTATION, step number 103 in FIG. 11.

A The first step 111 in FIG. 12 is labelling node i as DELTA and setting DELTA equal to the EXCESSFLOW of node i.

The second step 112 is labelling any link as BALANCED that connects two nodes r and s, where price(r)=price(s). Any link that is not labelled as BALANCED is not BALANCED, or unbalanced, except the permanent link labelled in step number 94 in FIG. 10.

The third step 113 in FIG. 12 is determining if there is a link labelled as BALANCED that is directed from a labelled node l to an unlabeled node j with FLOW less than CAPACITY.

If there is a link labelled as BALANCED that is directed from a labelled node l to an unlabeled node j with FLOW less than CAPACITY then the next step 114 is setting DELTA=CAPACITY−FLOW and labelling the link as FORWARD if CAPACITY minus FLOW on the link is less than DELTA at node l. Otherwise, the next step 115 is determining if there is a link labelled as BALANCED that is directed from an unlabeled node j to a labelled node l with FLOW greater than zero.

If there is a link labelled as BALANCED that is directed from an unlabeled node j to a labelled node l with FLOW greater than zero then the next step 116 is setting DELTA= FLOW and labelling the link as BACKWARD if DELTA at node l is larger than the FLOW on the link. Otherwise, the next step 117 is setting price(r)=price(r)+1 for each node r in the class rooted by node i and returning to the second step 112 for further processing.

After either step number 114 or step number 116, the next step 118 is labelling node j as DELTA.

The next step 119 is determining if node j is a root node.

If node j is a root node then the next step 120 is performing UPDATE FLOW POSITIVE FLOW AUGMENTATION from node i to node j. Otherwise, returning to the third step 113 for further processing. The steps for performing UPDATE FLOW POSITIVE FLOW AUGMENTATION 120 are listed in FIG. 14 and described below.

Figure 13:
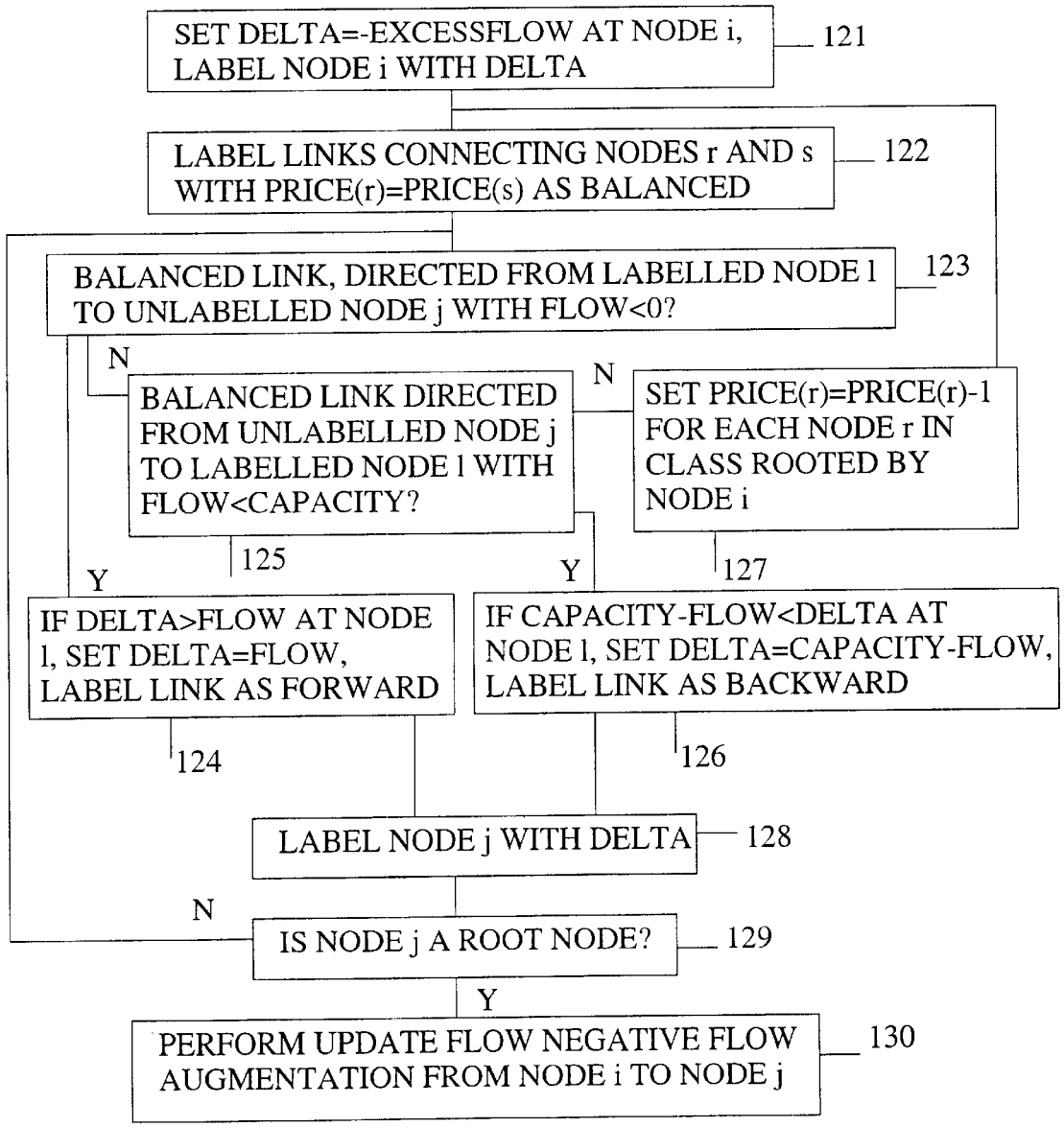
FIG. 13 is a flowchart of steps for performing NEGATIVE FLOW AUGMENTATION.

FIG. 13 lists the steps for performing NEGATIVE FLOW AUGMENTATION, step number 104 in FIG. 11.

The first step 121 in FIG. 13 is labelling node i as DELTA and setting DELTA equal to the negative of EXCESSFLOW of node i.

The second step 122 is labelling any link as BALANCED that connects two nodes r and s, where price(r)=price(s). Any link that is not labelled as BALANCED is not BALANCED, or unbalanced, except the permanent link labelled in step number 94 in FIG. 10.

The third step 123 in FIG. 13 is determining if there is a link labelled as BALANCED that is directed from a labelled node l to an unlabeled node j with FLOW greater than zero.

If there is a link labelled as BALANCED that is directed from a labelled node l to an unlabeled node j with FLOW greater than zero then the next step 124 is setting DELTA= FLOW and labelling the link as FORWARD if DELTA at node l is larger than FLOW on the link. Otherwise, the next step 125 is determining if there is a link labelled as BALANCED that is directed from an unlabeled node j to a labelled node l with FLOW less than CAPACITY.

If there is a link labelled as BALANCED that is directed from an unlabeled node j to a labelled node l with FLOW less than CAPACITY then the next step 126 is setting DELTA=CAPACITY−FLOW and labelling the link as BACKWARD if CAPACITY minus FLOW on the link is less than DELTA at node l. Otherwise, the next step 127 is setting price(r)=price(r)−1 for each node r in the class rooted by node i and returning to the second step 122 for further processing.

After either step number 124 or step number 126, the next step 128 is labelling node j as DELTA.

The next step 129 is determining if node j is a root node.

If node j is a root node then the next step 130 is performing UPDATE FLOW NEGATIVE FLOW AUGMENTATION from node i to node j. Otherwise, returning to the third step 123 for further processing. The steps for performing UPDATE FLOW NEGATIVE FLOW AUGMENTATION 130 are listed in FIG. 16 and described below.

Figure 14:
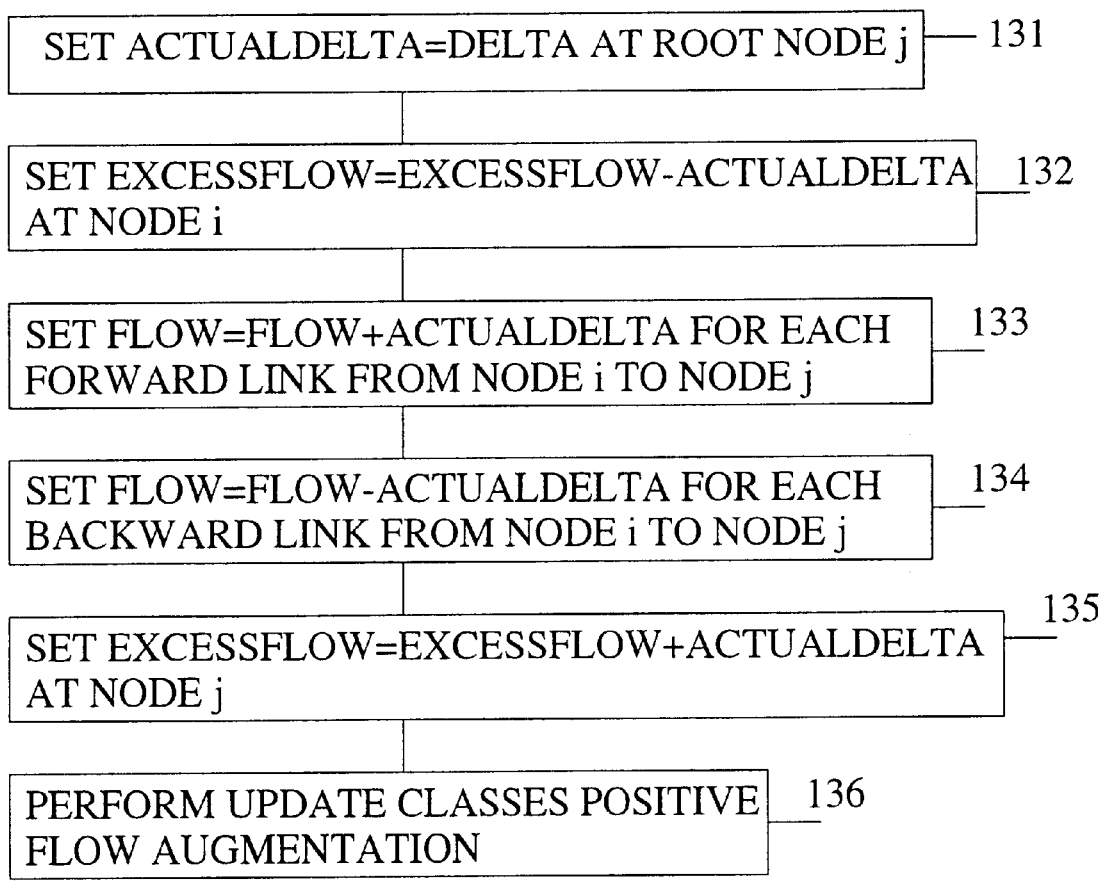
FIG. 14 is a flowchart of steps for performing UPDATE FLOW POSITIVE FLOW AUGMENTATION.

FIG. 14 is a flowchart of steps for performing UPDATE FLOW POSITIVE FLOW AUGMENTATION, step number 120 in FIG. 12.

The first step 131 in FIG. 14 is setting ACTUALDELTA= DELTA assigned to root node j.

The second step 132 is setting, at node i, EXCESSFLOW=EXCESSFLOW−ACTUALDELTA.

The third step 133 is setting FLOW=FLOW+ ACTUALDELTA for each link labelled FORWARD along a path from node i to node j.

The fourth step 134 is setting FLOW=FLOW− ACTUALDELTA for each link labelled BACKWARD along a path from node i to node j.

The fifth step 135 is setting, at node j, EXCESSFLOW= EXCESSFLOW+ACTUALDELTA.

The sixth step 136 is performing UPDATE CLASSES POSITIVE FLOW AUGMENTATION. The steps for performing UPDATE CLASSES POSITIVE FLOW AUGMENTATION 136 are listed in FIG. 15 and described below.

Figure 15:
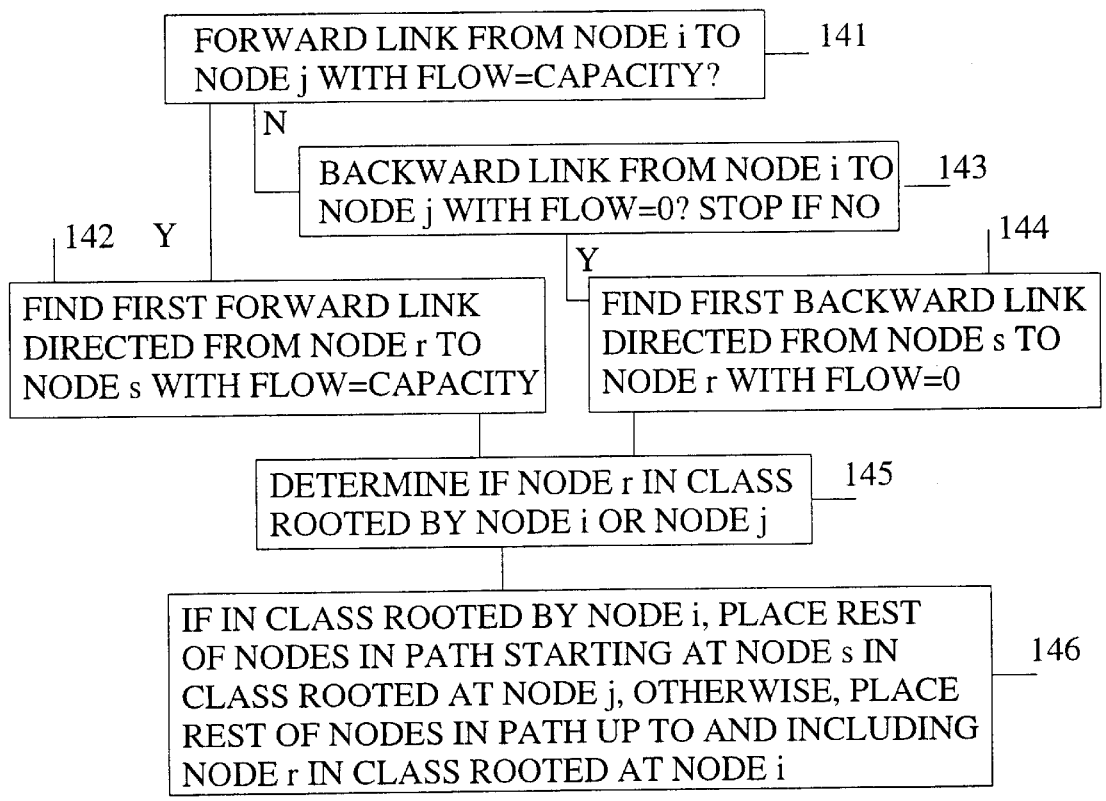
FIG. 15 is a flowchart of steps for performing UPDATE CLASSES POSITIVE FLOW AUGMENTATION.

FIG. 15 is a flowchart of the steps for performing UPDATE CLASSES POSITIVE FLOW AUGMENTATION, step number 136 in FIG. 14.

The first step 141 in FIG. 15 is determining if there is a link labelled as FORWARD along a path from node i to node j with FLOW=CAPACITY.

If there is a link labelled as FORWARD along a path from node i to node j with FLOW=CAPACITY then the next step 142 is finding the first link directed from node r to node s along the path from node i to node j that is labelled as FORWARD and has FLOW=CAPACITY. Otherwise, the next step 143 is determining if there is a link along the path from node i to node j that is labelled as BACKWARD and has FLOW=0.

If there is a link along the path from node i to node j that is labelled as BACKWARD and has FLOW=0 then the next step 144 is finding the first link directed from node s to node r along the path from node i to node j that is labelled as BACKWARD and has FLOW=0. Otherwise, stop.

The next step 145 after either step number 142 or step number 144 is placing the nodes in the path from node s to node r, except node r, in the class rooted at node j if node r is in the class rooted at node i.

The next step 146 is placing the nodes in the path from node s to node r, except node r, in the class rooted at node i if node r is in the class rooted at node j.

Figure 16:
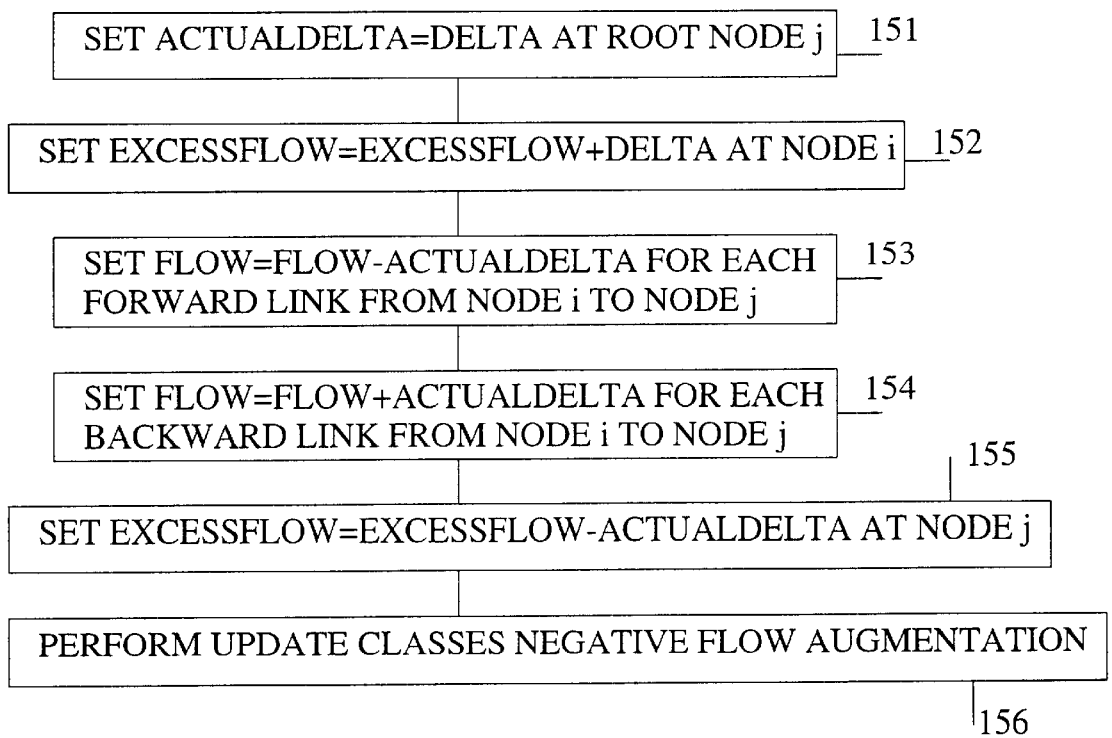
FIG. 16 is a flowchart of steps for performing UPDATE FLOW NEGATIVE FLOW AUGMENTATION.

FIG. 16 is a flowchart of steps for performing UPDATE FLOW NEGATIVE FLOW AUGMENTATION, step number 130 in FIG. 13.

The first step 151 in FIG. 16 is setting ACTUALDELTA= DELTA at root node j.

The second step 152 is setting, at node i, EXCESSFLOW=EXCESSFLOW+ACTUALDELTA.

The third step 153 is setting FLOW=FLOW− ACTUALDELTA for each link labelled FORWARD along a path from node i to node j.

The fourth step 154 is setting FLOW=FLOW+ ACTUALDELTA for each link labelled BACKWARD along a path from node i to node j.

The fifth step 155 is setting, at node j, EXCESSFLOW= EXCESSFLOW−ACTUALDELTA.

The sixth step 156 is performing UPDATE CLASSES NEGATIVE FLOW AUGMENTATION. The steps for performing UPDATE CLASSES NEGATIVE FLOW AUGMENTATION 156 are listed in FIG. 17 and described below.

Figure 17:
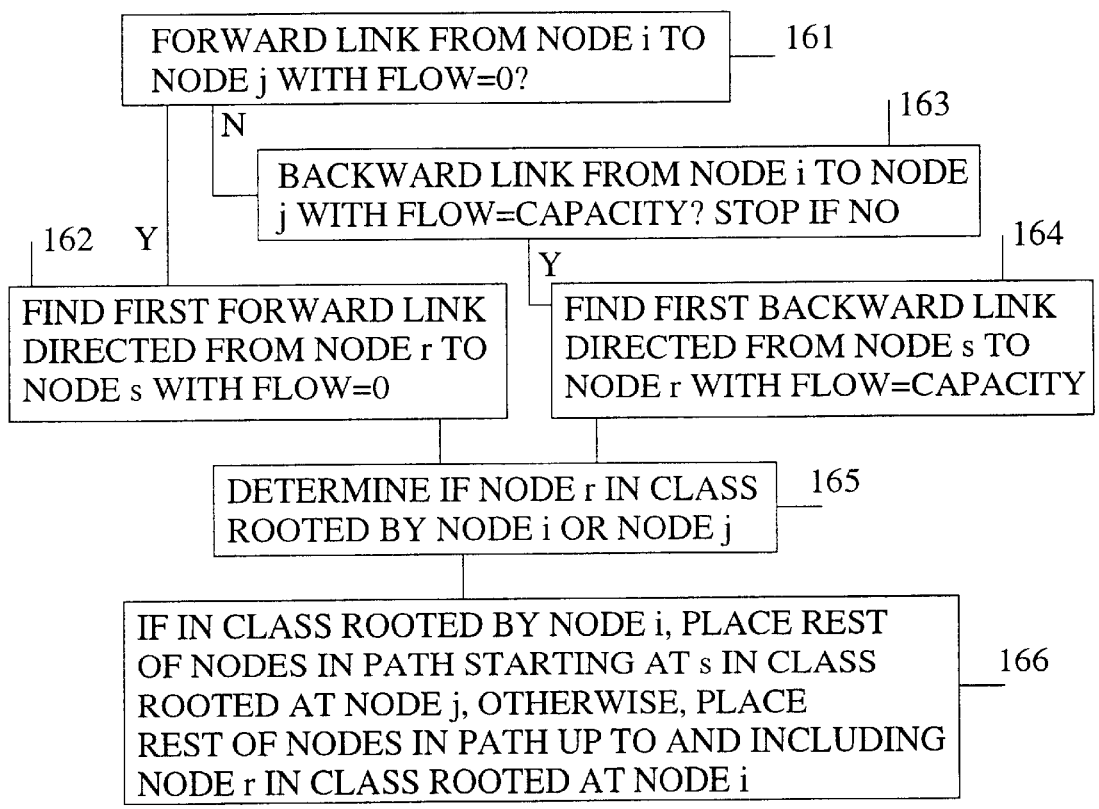
FIG. 17 is a flowchart of steps for performing UPDATE CLASSES NEGATIVE FLOW AUGMENTATION.

FIG. 17 is a flowchart of the steps for performing UPDATE CLASSES NEGATIVE FLOW AUGMENTATION, step number 156 in FIG. 16.

The first step 161 in FIG. 17 is determining if there is a link labelled as FORWARD along a path from node i to node j with FLOW=0.

If there is a link labelled as FORWARD along a path from node i to node j with FLOW=0 then the next step 162 is finding the first link directed from node r to node s along the path from node i to node j that is labelled as FORWARD and has FLOW=0. Otherwise, the next step 163 is determining if there is a link along the path from node i to node j that is labelled as BACKWARD and has FLOW=CAPACITY.

If there is a link along the path from node i to node j that is labelled as BACKWARD and has FLOW=CAPACITY then the next step 164 is finding the first link directed from node s to node r along the path from node i to node j that is labelled as BACKWARD and has FLOW=CAPACITY. Otherwise, stop.

The next step 165 after either step number 162 or step number 164 is placing the nodes in the path from node s to node r, except node r, in the class rooted at node j if node r is in the class rooted at node i.

The next step 166 is placing the nodes in the path from node s to node r, except node r, in the class rooted at node i if node r is in the class rooted at node j.

Figure 18:
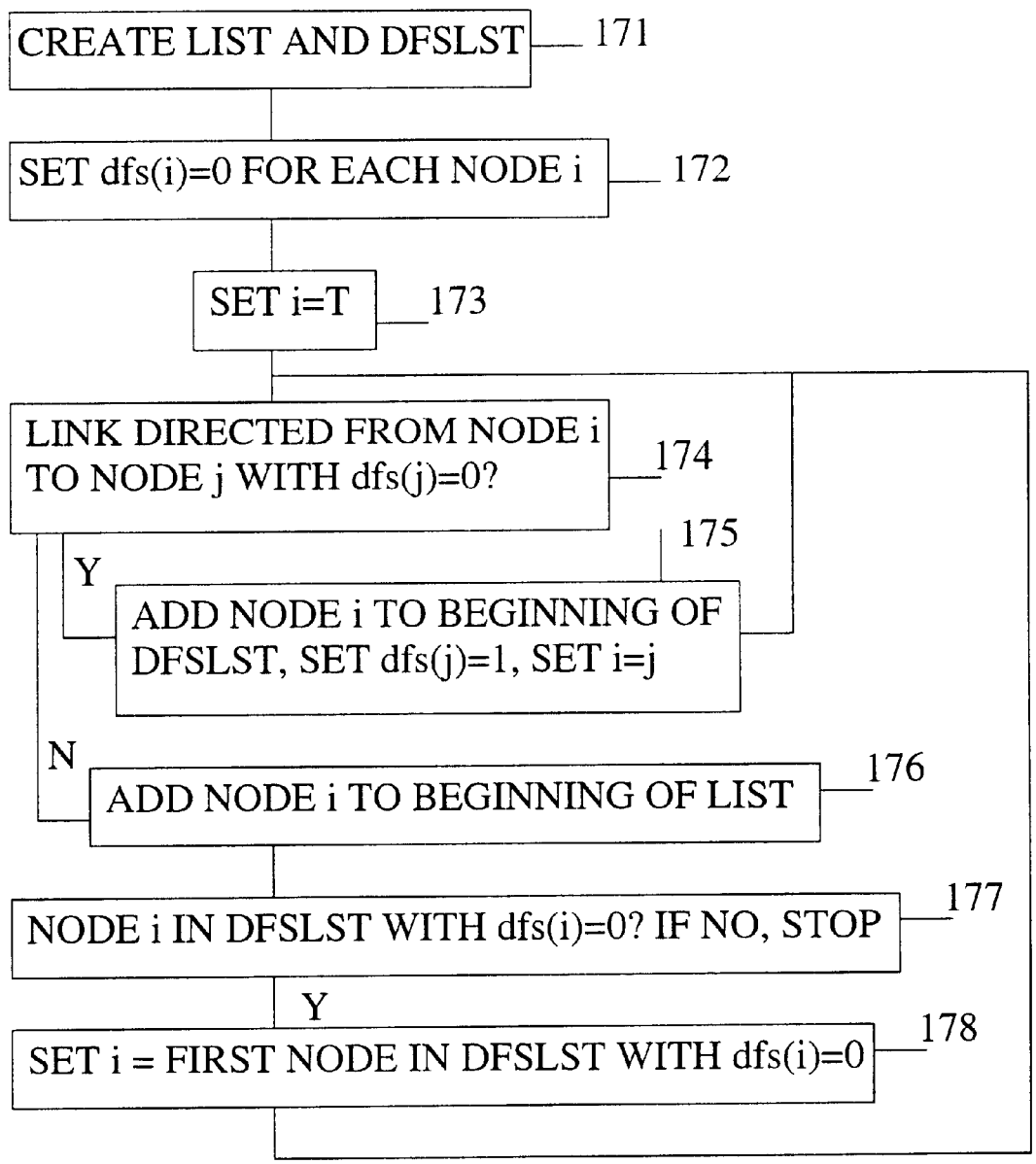
FIG. 18 is a flowchart of steps for performing PASS 1 THROUGH RESIDUAL GRAPH.
Figure 19:
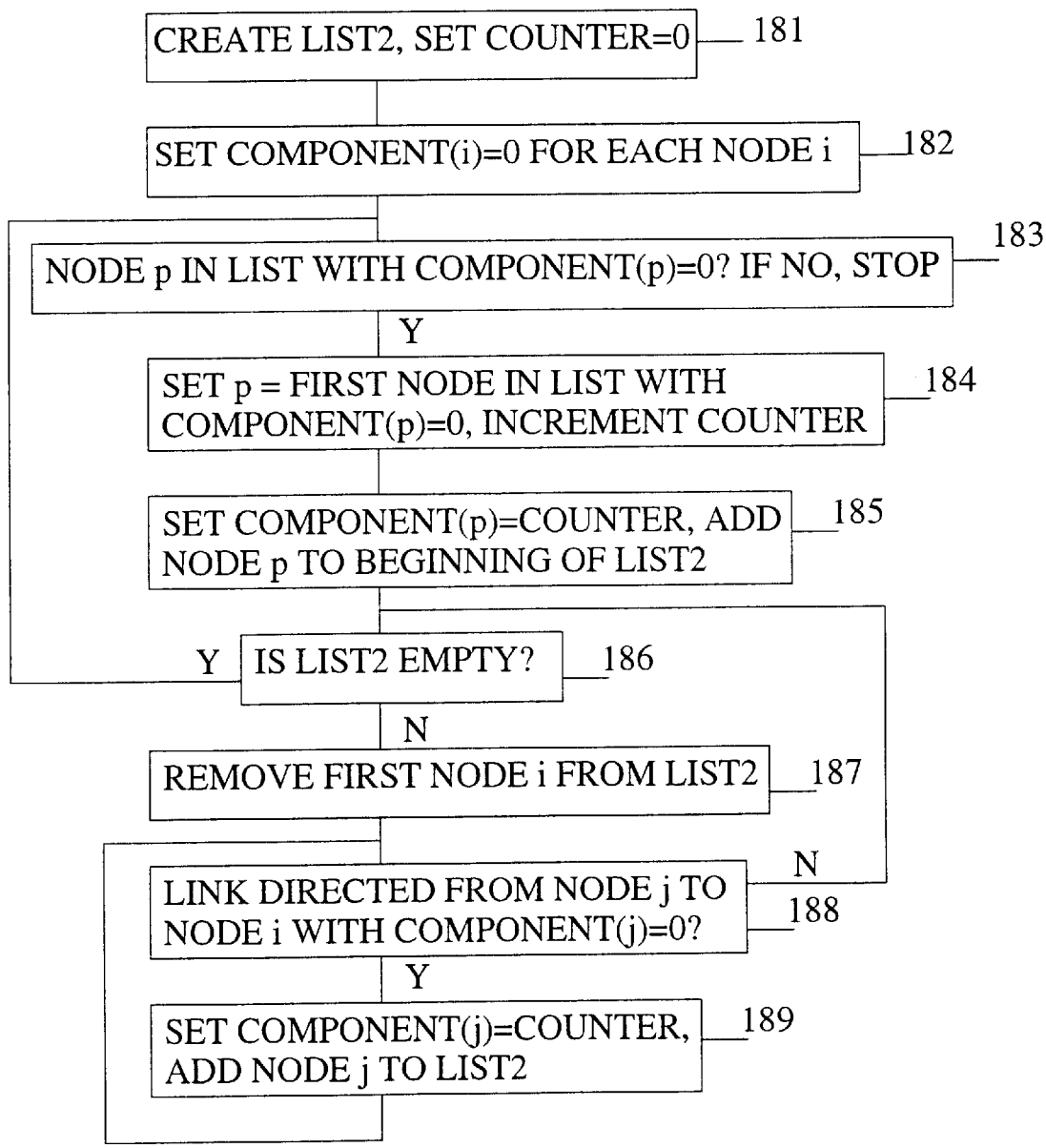
FIG. 19 is a flowchart of steps for performing PASS 2 THROUGH RESIDUAL GRAPH.
Figure 20:
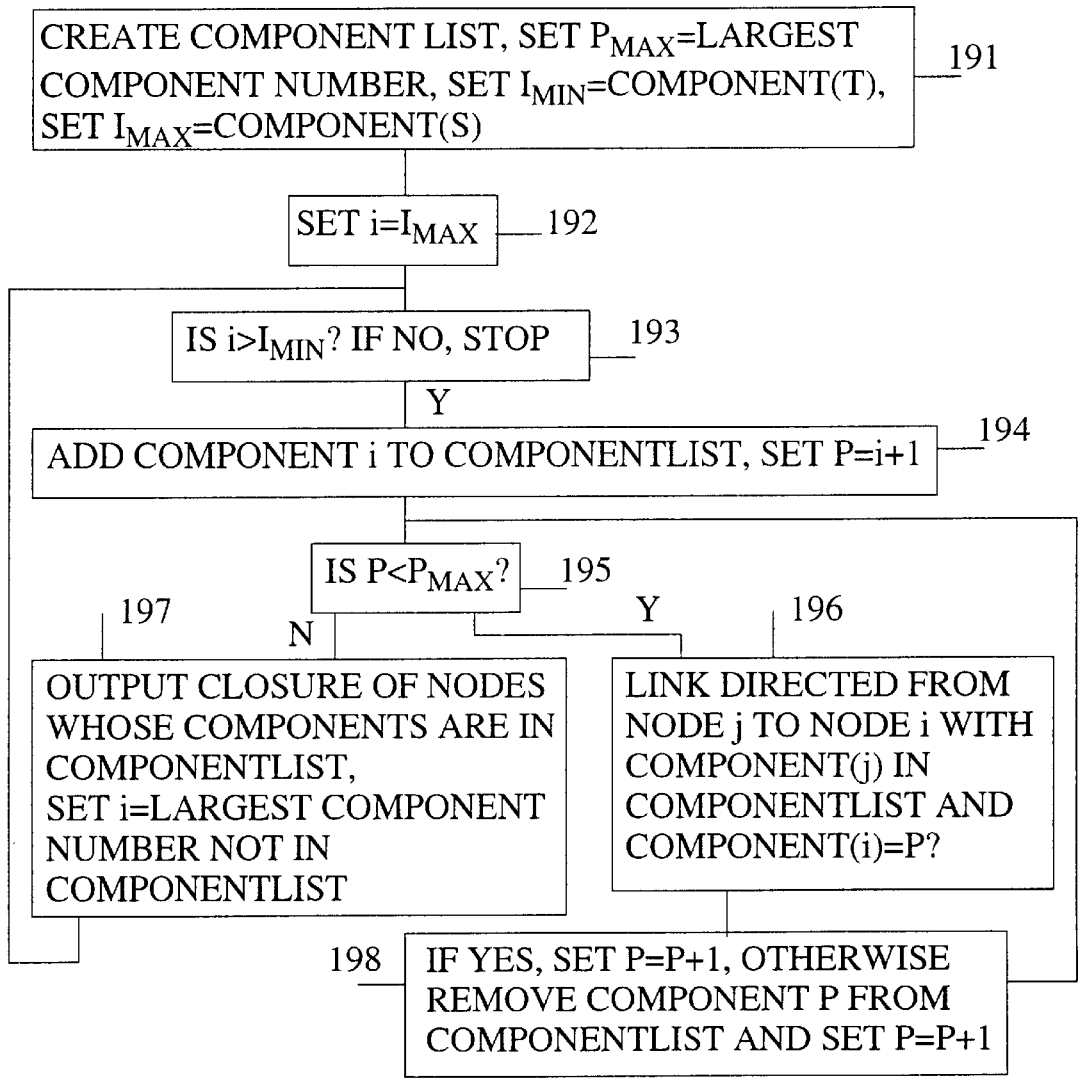
FIG. 20 is a flowchart of steps for performing IDENTIFY CLOSURES.

To accomplish the twelfth step 12 of FIG. 1, which is finding each set of nodes in the residual graph that includes node S, does not include node T, and does not include a link directed from a node within the set to a node outside of the set, two passes must be made through the residual graph and the steps of IDENTIFY CLOSURES must be performed. FIG. 18 is a flowchart of the steps of the first pass (i.e., PASS 1 THROUGH RESIDUAL GRAPH), FIG. 19 is a flowchart of the steps of the second pass (i.e., PASS 2 THROUGH RESIDUAL GRAPH), and FIG. 20 is a flowchart of the steps of IDENTIFY CLOSURES.

The first step 171 in FIG. 18 for performing PASS 1 THROUGH RESIDUAL GRAPH is making a first list LIST and a second list DFLIST.

The second step 172 is setting a variable dfs(i)=0 for each node i.

The third step 173 is setting i=T

The fourth step 174 is determining if there is a link directed from node i to node j with dfs(j)=0.

If there is a link directed from node i to node j with dfs(j)=0 then the next step 175 is adding node i to the beginning of DFSLIST, setting dfs(j)=1, setting i=j, and returning to the fourth step 174 for further processing. Otherwise, the next step 176 is adding node i to the beginning of LIST.

If step number 176 was the last step performed then the next step 177 is determining if there is a node i in DFSLIST with dfs(i)=0.

If there is a node i in DFSLIST with dfs(i)=0 then the next step 178 is making i the first node in DFSLIST. Otherwise, stopping.

The first step 181 in FIG. 19 for performing PASS 2 THROUGH RESIDUAL GRAPH is making a first list LIST2 and setting counter=0.

The second step 182 is setting component(i)=0 for each node i, where a component is a group of nodes that go together.

The third step 183 is determining if there is a node p in LIST with component(p)=0.

If there is a node p in LIST with component(p)=0 then the next step 184 is making p the first node in the list and incrementing counter by one. Otherwise, stop.

If step number 184 was the last step performed then the next step 185 is setting component(p)=counter and adding node p to the beginning of LIST2.

The next step 186 is determining if LIST2 is empty.

If LIST2 is empty then return to the third step 183 for further processing. Otherwise, the next step 187 is removing the first node i from LIST2.

The next step 188 is determining if there is a link directed from node j to node i with component(j)=0.

If there is a link directed from node j to node i with component(j)=0 then the next step 189 is setting component (j)=counter, adding node j to LIST2, and returning to step number 188 for further processing. Otherwise, returning to step number 186 for further processing.

FIG. 20 is a flowchart of the steps of IDENTIFY CLOSURES.

The first step 191 in FIG. 20 is creating a list COMPONENTLIST, setting Pmax=the largest component number, setting Imin=component(T), and setting Imax=component(S), where a component is a group of nodes that go together, and where the components are numbered consecutively starting with the number one.

The second step 192 is setting i=Imax.

The third step 193 is determining if i>Imin.

If i>Imin then the next step 194 is adding component i to COMPONENTLIST and setting p=i+1. Otherwise, stopping.

If step number 194 was the last step performed then the next step 195 is determining if p<Pmax.

If p<Pmax then the next step 196 is determining if there is a link directed from node j to node i with component(j) in COMPONENTLIST and component(i)=p. Otherwise, the next step 197 is identifying those nodes whose components are in COMPONENTLIST as a closure, setting i=largest component number that is not in COMPONENTLIST, and returning to step number 193 for further processing.

If step number 196 was the last step performed and there is a link directed from node j to node i with component(j) in COMPONENTLIST and component(i)=p then the next step 198 is setting p=p+1 and returning to step number 195 for further processing. Otherwise, removing component p from COMPONENTLIST and returning to step number 198 for further processing.

What is claimed is:

1. A method of identifying all minimum-cost cutsets in a network to isolate one node in the network from another node in the network, comprising the steps of:
   a) receiving a suitable network, where the network includes nodes and links between the nodes, and where the links may be unidirectional and bidirectional;
   b) replacing each bidirectional link with two unidirectional links, where the two unidirectional links are parallel to, and in opposite directions from, each other;
   c) assigning a cost to each node and link in the network;
   d) choosing two nodes in the network, a source node S and a termination node T, between which all minimum-cost cutsets are to be found;
   e) removing any extraneous nodes and links that are not along a path from node S to node T;
   f) adding a node next to each node that is original to the network;
   g) moving, for each node that is original to the network, the links directed out of the original node to its added node so that such links are directed out of the added node;
   h) adding, to each node that is original to the network, a link directed out of the original node and into its added node;
   i) assigning a cost to each link added in the last step that is equal to the cost of the corresponding node that is original to the network;

k) finding the paths from node S to node T that maximize the amount of flow from node S to node T, where the flow capacity of each node and link is equal to the cost assigned thereto;

l) generating a residual graph, comprising the steps of:
   i) including all nodes original to the network;
   ii) including all nodes added to the network;
   iii) including all links, with direction maintained, from the network that are not in a path that maximizes flow from node S to node T;
   iv) including all links, with directions reversed, from the network that are in a path that maximizes flow from node S to node T and have flow at capacity;
   v) including all links, with direction maintained, from the network that are in a path that maximizes flow from node S to node T and have flow at less than capacity; and
   vi) adding a link, in the opposite direction, for each link from the network that is in a path that maximizes flow from node S to node T and has flow at less than capacity;

m) finding each set of nodes in the residual graph that includes node S, does not include node T, and does not include a link directed from a node within the set to a node outside of the set, where such a set is a closure;

n) finding, for each closure found in the last step, any links in the network as modified by step (b) through step (i) connected to the closure that are not members of the closure, where such links constitute a minimum-cost cutset;

o) selecting the minimum-cost cutset from those found in the last step that is the most convenient cutset on which to act; and p) eliminating the links and nodes as required by the minimum-cost cutset chosen in the last step to isolate node S from node T.

2. The method of claim 1, wherein said step of removing any extraneous nodes and links that are not along a path from node S to node T is comprised of the steps of:
   a) calculating, for each node i in the network except nodes S and T, indegree(i), where indegree(i) is the number of links directed toward node i;
   b) calculating, for each node i in the network except nodes S and T, outdegree(i), where outdegree(i) is the number of links directed away from node i;
   c) determining, for each node i in the network except nodes S and T, if indegree(i)=0;
   d) if there is a node i with indegree(i)=0 then subtracting one from outdegree(j) if node j is connected to node i, removing node i from the network, and returning to step (c) for further processing, otherwise, determining, for each node i in the network except nodes S and T, if outdegree(i)=0.
   e) if there is a node i with outdegree(i)=0 then subtracting one from indegree(j) if node j is connected to node i, removing node i from the network, and returning to step (c) for further processing, otherwise determining if there is a node i with indegree(i)=outdegree(i)=1, where the link directed toward node i comes from node j, and where the link directed away from node i is directed toward node j; and
   f) if there is a node i with indegree(i)=outdegree(i)=1, where the link directed toward node i comes from node j, and where the link directed away from node i is directed toward node j then subtracting one from indegree(j) and from outdegree(j), removing node i from the network, and returning to step (c) for further processing, otherwise, removing any links that are not connected to two nodes.

3. The method of claim 1, wherein said step of finding the paths from node S to node T that maximize the amount of flow from node S to node T is comprised of the steps of:
   a) assigning each node in the network to its own class and marking each node as the root node of its class;
   b) setting INITIALIZEFLOW=0 for every link, setting PRICE(i)=0 for each node i, and setting PRICE(S)=1 for node S;
   c) setting CAPACITY for each link equal to the cost associated with the corresponding link and setting FLOW equal to the sum of the CAPACITYs of the links directed out of node S;
   d) adding a link directed from node T to node S, assigning to the link the value of FLOW defined in the previous step, and labelling the link BALANCED;
   e) merging nodes S and T into one class with root node T;
   f) determining if any of the nodes has EXCESSFLOW that is nonzero, where EXCESSFLOW=Σ(flows into the node)−Σ(flows out of the node); and
   (g) if there is no node with a nonzero EXCESSFLOW then returning the maximum flow solution, otherwise, performing PUSHFLOW ITERATIONS and returning to the step (f).

4. The method of claim 3, wherein the step of performing PUSHFLOW ITERATIONS is comprised of the steps of:
   a) finding the root node i that has the largest ratio of EXCESSFLOW to class size in absolute magnitude;
   b) determining if EXCESSFLOW for root node i is positive;
   c) if EXCESSFLOW for root node i is positive then performing POSITIVE FLOW AUGMENTATION from node i, otherwise, performing NEGATIVE FLOW AUGMENTATION from root node i;
   d) determining if EXCESSFLOW=0 at root node i;
   e) if EXCESSFLOW=0 for root node i then merging the class containing root node i with the class containing root node j and designating node j as the root of class formed in this step, otherwise, returning to the step (b) for further processing.

5. The method of claim 4, wherein said step of performing POSITIVE FLOW AUGMENTATION is comprised of the steps of:
   a) labelling node i as DELTA and setting DELTA equal to the EXCESSFLOW of node i;
   b) labelling any link as BALANCED that connects two nodes r and s, where price(r)=price(s);
   c) determining if there is a link labelled as BALANCED that is directed from a labelled node l to an unlabeled node j with FLOW less than CAPACITY;
   d) if there is a link labelled as BALANCED that is directed from a labelled node l to an unlabeled node j with FLOW less than CAPACITY then setting DELTA=CAPACITY−FLOW and labelling the link as FORWARD if CAPACITY minus FLOW on the link is less than DELTA at node l, otherwise, determining if there is a link labelled as BALANCED that is directed from an unlabeled node j to a labelled node l with FLOW greater than zero;
   e) if there is a link labelled as BALANCED that is directed from an unlabeled node j to a labelled node l with FLOW greater than zero then setting DELTA=FLOW and labelling the link as BACKWARD if DELTA at node l is larger than the FLOW on the link, otherwise, setting price(r)=price(r)+1 for each node r in the class rooted by node i and returning to step (b) for further processing;

f) labelling node j as DELTA;

g) determining if node j is a root node; and h) if node j is a root node then performing UPDATE FLOW POSITIVE FLOW AUGMENTATION from node i to node j, otherwise, returning to step (c) for further processing.

6. The method of claim 5, wherein said step of performing UPDATE FLOW POSITIVE FLOW AUGMENTATION is comprised of the steps of:

a) setting ACTUALDELTA=DELTA assigned to root node j;

b) setting, at node i, EXCESSFLOW=EXCESSFLOW−ACTUALDELTA;

c) setting FLOW=FLOW+ACTUALDELTA for each link labelled FORWARD along a path from node i to node j;

d) setting FLOW=FLOW−ACTUALDELTA for each link labelled BACKWARD along a path from node i to node j;

e) setting, at node j, EXCESSFLOW=EXCESSFLOW+ACTUALDELTA; and f) performing UPDATE CLASSES POSITIVE FLOW AUGMENTATION.

7. The method of claim 6, wherein said step of performing UPDATE CLASSES POSITIVE FLOW AUGMENTATION is comprised of the steps of:

a) determining if there is a link labelled as FORWARD along a path from node i to node j with FLOW=CAPACITY;

b) if there is a link labelled as FORWARD along a path from node i to node j with FLOW=CAPACITY then finding the first link directed from node r to node s along the path from node i to node j that is labelled as FORWARD and has FLOW=CAPACITY, otherwise, determining if there is a link along the path from node i to node j that is labelled as BACKWARD and has FLOW=0;

c) if there is a link along the path from node i to node j that is labelled as BACKWARD and has FLOW=0 then finding the first link directed from node s to node r along the path from node i to node j that is labelled as BACKWARD and has FLOW=0, otherwise, stopping;

d) placing the nodes in the path from node s to node r, except node r, in the class rooted at node j if node r is in the class rooted at node i; and e) placing the nodes in the path from node s to node r, except node r, in the class rooted at node i if node r is in the class rooted at node j.

8. The method of claim 4, wherein said step of performing NEGATIVE FLOW AUGMENTATION is comprised of the steps of:

a) labelling node i as DELTA and setting DELTA equal to the negative of EXCESSFLOW of node i;

b) labelling any link as BALANCED that connects two nodes r and s, where price(r)=price(s);

c) determining if there is a link labelled as BALANCED that is directed from a labelled node l to an unlabeled node j with FLOW greater than zero;

d) if there is a link labelled as BALANCED that is directed from a labelled node l to an unlabeled node j with FLOW greater than zero then setting DELTA=FLOW and labelling the link as FORWARD if DELTA at node l is larger than FLOW on the link, otherwise, determining if there is a link labelled as BALANCED that is directed from an unlabeled node j to a labelled node l with FLOW less than CAPACITY;

e) if there is a link labelled as BALANCED that is directed from an unlabeled node j to a labelled node l with FLOW less than CAPACITY then setting DELTA=CAPACITY−FLOW and labelling the link as BACKWARD if CAPACITY minus FLOW on the link is less than DELTA at node l, otherwise, setting price(r)=price(r)−1 for each node r in the class rooted by node i and returning to step (b) for further processing;

f) labelling node j as DELTA;

g) determining if node j is a root node; and h) if node j is a root node then performing UPDATE FLOW NEGATIVE FLOW AUGMENTATION from node i to node j, otherwise, returning to step (c) for further processing.

9. The method of claim 8, wherein said step of performing UPDATE FLOW NEGATIVE FLOW AUGMENTATION is comprised of the steps of:

a) setting ACTUALDELTA=DELTA at root node j;

b) setting, at node i, EXCESSFLOW=EXCESSFLOW+ACTUALDELTA;

c) setting FLOW=FLOW−ACTUALDELTA for each link labelled FORWARD along a path from node i to node j;

d) setting FLOW=FLOW+ACTUALDELTA for each link labelled BACKWARD along a path from node i to node j;

e) setting, at node j, EXCESSFLOW=EXCESSFLOW−ACTUALDELTA; and f) performing UPDATE CLASSES NEGATIVE FLOW AUGMENTATION.

10. The method of claim 9, wherein said step of performing UPDATE CLASSES NEGATIVE FLOW AUGMENTATION is comprised of the steps of:

a) determining if there is a link labelled as FORWARD along a path from node i to node j with FLOW=0;

b) if there is a link labelled as FORWARD along a path from node i to node j with FLOW=0 then finding the first link directed from node r to node s along the path from node i to node j that is labelled as FORWARD and has FLOW=0, otherwise, determining if there is a link along the path from node i to node j that is labelled as BACKWARD and has FLOW=CAPACITY;

c) if there is a link along the path from node i to node j that is labelled as BACKWARD and has FLOW=CAPACITY then finding the first link directed from node s to node r along the path from node i to node j that is labelled as BACKWARD and has FLOW=CAPACITY, otherwise, stopping;

d) placing the nodes in the path from node s to node r, except node r, in the class rooted at node j if node r is in the class rooted at node i; and e) placing the nodes in the path from node s to node r, except node r, in the class rooted at node i if node r is in the class rooted at node j.

11. The method of claim 1, wherein said step of finding each set of nodes in the residual graph that includes node S, does not include node T, and does not include a link directed from a node within the set to a node outside of the set is comprised of the steps of:

a) making a first list LIST and a second list DFLIST;

b) setting a variable dfs(i)=0 for each node i;

c) setting i=T;

d) determining if there is a link directed from node i to node j with dfs(j)=0;

e) if there is a link directed from node i to node j with dfs(j)=0 then adding node i to the beginning of DFSLIST, setting dfs(j)=1, setting i=j, and returning to step (d) for further processing, otherwise, adding node i to the beginning of LIST;

f) determining if there is a node i in DFSLIST with dfs(i)=0; and g) if there is a node i in DFSLIST with dfs(i)=0 then making i the first node in DFSLIST, otherwise, stopping.

12. The method of claim 11, wherein said step of finding each set of nodes in the residual graph that includes node S, does not include node T, and does not include a link directed from a node within the set to a node outside of the set further comprises the steps of:

a) making a first list LIST2 and setting counter=0.

b) setting component(i)=0 for each node i, where a component is a group of nodes that go together;

c) determining if there is a node p in LIST with component(p)=0;

d) if there is a node p in LIST with component(p)=0 then making p the first node in the list and incrementing counter by one, otherwise, stopping;

e) setting component(p)=counter and adding node p to the beginning of LIST2;

f) determining if LIST2 is empty;

g) if LIST2 is empty then returning to step (c) for further processing, otherwise, removing the first node i from LIST2;

h) determining if there is a link directed from node to node i with component(j)=0; and i) if there is a link directed from node j to node i with component(j)=0 the n setting component(j)=counter, adding node j to LIST2, and returning to step (h) for further processing, otherwise, returning to step (f) for further processing.

13. The method of claim 12, wherein said step of finding each set of nodes in the residual graph that includes node S, does not include node T, and does not include a link directed from a node within the set to a node outside of the set further comprises the steps of:

a) creating a list COMPONENTLIST, setting Pmax=the largest component number, setting Imin=component (T), and setting Imax=component(S), where a component is a group of nodes that go together, and where the components are numbered consecutively starting with the number one;

b) setting i=Imax;

c) determining if i>Imin;

d) if i>Imin then adding component i to COMPONENTLIST and setting p=i+1, otherwise, stopping;

e) determining if p<Pmax;

f) if p<Pmax then determining if there is a link directed from node j to node i with component(j) in COMPONENTLIST and component(i)=p, otherwise, identifying those nodes whose components are in COMPONENTLIST as a closure, setting i=largest component number that is not in COMPONENTLIST, and returning to step (c) for further processing; and g) if there is a link directed from node j to node i with component(j) in COMPONENTLIST and component (i)=p then setting p=p+1 and returning to step (e) for further processing, otherwise, removing component p from COMPONENTLIST and returning to step (g) for further processing.

* * * * *